United States Patent [19]

Love

[11] Patent Number: 5,068,553
[45] Date of Patent: Nov. 26, 1991

[54] DELAY STAGE WITH REDUCED V dd DEPENDENCE

[75] Inventor: Andrew M. Love, Stafford, Tex.

[73] Assignee: Texas Instruments Incorporated, Dallas, Tex.

[21] Appl. No.: 559,433

[22] Filed: Jul. 24, 1990

Related U.S. Application Data

[63] Continuation of Ser. No. 265,106, Oct. 31, 1988, abandoned.

[51] Int. Cl.$^5$ .............................................. H03K 5/13
[52] U.S. Cl. ..................................... 307/605; 307/451; 307/579; 307/585; 307/576; 307/594; 307/482; 307/578; 307/448
[58] Field of Search ............... 307/605, 451, 579, 270, 307/585, 576, 594, 482, 578, 448, 603, 475; 365/104

[56] References Cited

U.S. PATENT DOCUMENTS

| | | | |
|---|---|---|---|
| 3,927,334 | 12/1975 | Callahan | 307/448 |
| 4,164,842 | 8/1979 | Ebihara | 58/23 A |
| 4,176,289 | 11/1979 | Leach et al. | 307/270 |
| 4,499,387 | 2/1985 | Konishi | 307/585 |
| 4,591,745 | 5/1986 | Shen | 307/594 |
| 4,609,836 | 9/1986 | Koike | 307/451 |
| 4,622,482 | 11/1986 | Ganger | 307/263 |
| 4,649,295 | 3/1987 | McLaughlin et al. | 307/446 |
| 4,697,111 | 9/1987 | Van Zanten et al. | 307/482 |
| 4,701,635 | 10/1987 | Kawazoe et al. | 307/270 |
| 4,707,625 | 11/1987 | Yanagisawa | 307/578 |
| 4,727,266 | 2/1989 | Fujii et al. | 307/443 |
| 4,797,579 | 1/1989 | Lewis | 307/443 |
| 4,806,801 | 2/1989 | Argade et al. | 307/451 |
| 4,827,159 | 5/1989 | Naganuma | 307/451 |
| 4,885,480 | 12/1989 | Faris et al. | 307/448 |
| 4,890,017 | 12/1989 | Masuda et al. | 307/451 |
| 4,897,559 | 1/1990 | Yun-Ho | 307/578 |

FOREIGN PATENT DOCUMENTS 0156226  9/1983  Japan ................................... 307/605

OTHER PUBLICATIONS

Mead et al.; "Introduction to VLSI Systems", pp. 1–37, Oct. '80.
Graig: "CMOS Timing Generator", IBM Technical Disclosure Bulletin, vol. 25, No. 4, Sep. 1982, pp. 2249–2250.
"CMOS Delay Circuit", IBM Technical Disclosure Bulletin, vol. 27, No. 12, May 1985, pp. 7134–7135.

Primary Examiner—Stanley D. Miller
Assistant Examiner—Terry D. Cunningham
Attorney, Agent, or Firm—Ronald O. Neerings; James T. Comfort; N. Rhys Merrett

[57] ABSTRACT

A delay stage (60) has a delay period of reduced dependence on the level of a first voltage supply ($V_{dd}$). First and second inverter stages (78, 90) each have p-channel transistors (68, 86) and n-channel transistors (70, 88). The gates (64, 66) of the first inverter pair are connected to an input node (62). A fixed resistor (72) is inserted between the current path of the p-channel transistor (68) of the first inverter pair and a signal node (76). The current path of the n-channel transistor (66) of the first inverter is operable to connect the signal node (76) to ground. A MOSFET capacitor (80) is coupled to the signal node (76), as are the gates (82, 84) of the second inverter transistor (86, 88). The current path of the p-channel transistor (86) of the second inverter is operable to connect the voltage supply ($V_{dd}$) to an output node (92), and the current path of the n-channel transistor (88) of the second inverter (90) is operable to connect the output node (92) to ground. The trigger point of the second inverter stage (90) is chosen to be substantially the same as the difference between the voltage supply level and the threshold voltage of the transistor (86).

11 Claims, 1 Drawing Sheet

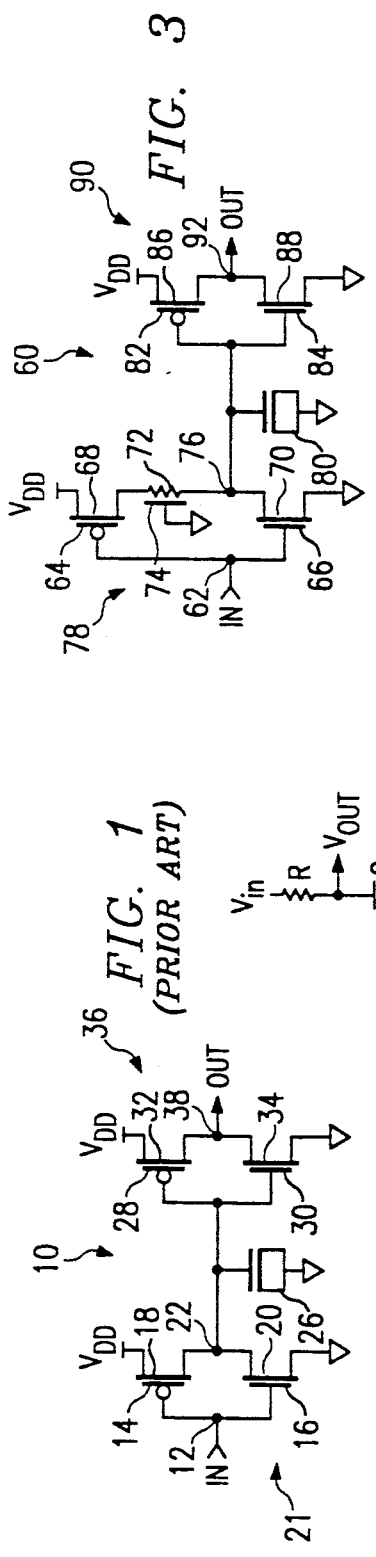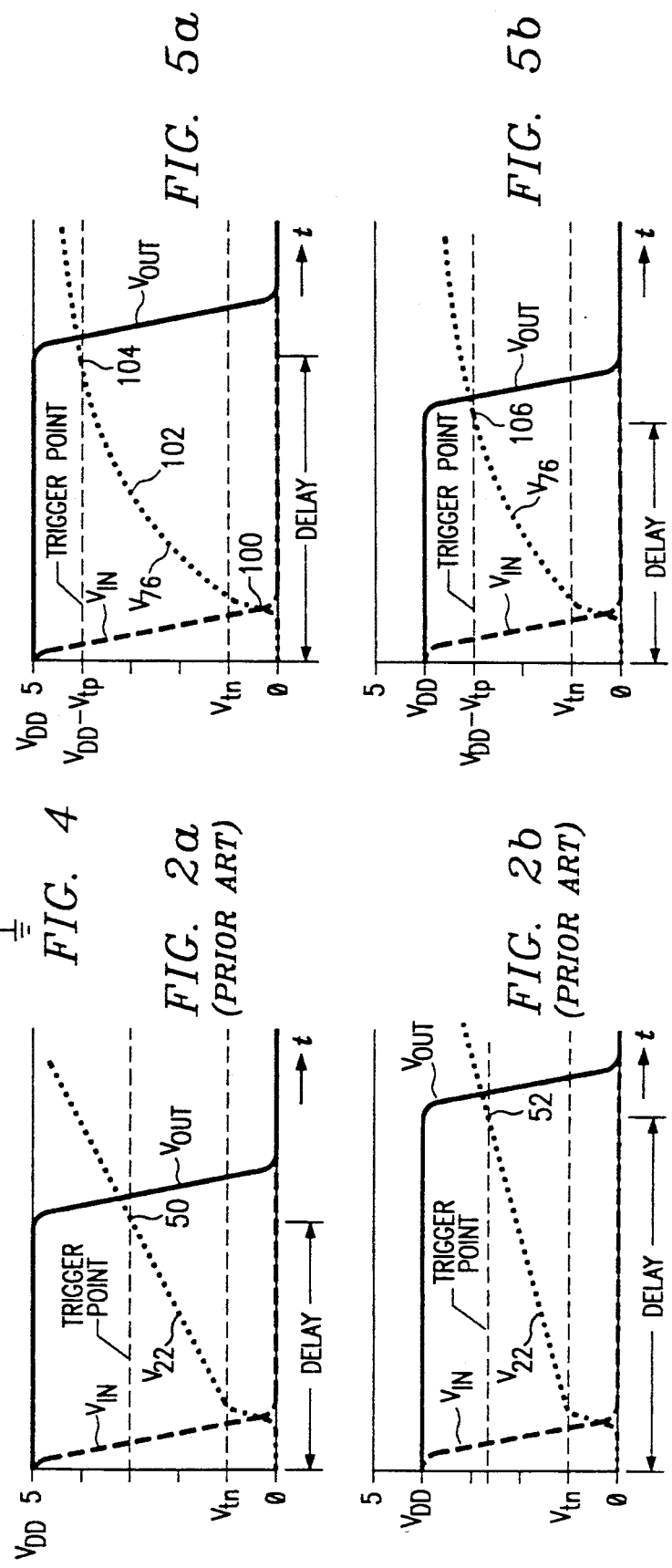

DELAY STAGE WITH REDUCED $V_{dd}$ DEPENDENCE

This application is a continuation, application Ser. No. 07/265,106, filed Oct. 31, 1988, now abandoned.

TECHNICAL FIELD OF THE INVENTION

The present invention relates in general to methods and apparatus for delaying signals, and more particularly relates to a method and apparatus for delaying a signal whose delay period has decreased dependence on voltage supply level variations.

BACKGROUND OF THE INVENTION

In the design of a VLSI semiconductor device, it is common to employ a delay stage to generate timing signals at various times. In some applications, it is desirable to use a delay stage that has minimum variations in its delay period as the voltage supply (such as $V_{dd}$) changes. One such application is in the generation of sense amplifier timing signals of a dynamic random access memory (DRAM). At a low $V_{dd}$ level, all circuits tend to work slowly, and the sense amplifier clocks must fire quickly enough to meet storage cell restore time requirements. At a high voltage level, all circuits tend to draw more power supply current, and the sense amplifier clocks must work slowly enough to avoid exceeding peak current specifications.

Like other circuits, however, delay stages also tend to work slowly at low $V_{dd}$ levels and quickly at high $V_{dd}$ levels. If this delay variation is too large, an ordinary delay stage will be unable to satisfy the requirements at both extremes. A need has therefore arisen for a delay stage having reduced dependence in the length of its delay period on variations in the voltage supply level, or even a dependence in the opposite direction.

SUMMARY OF THE INVENTION

One aspect of the present invention comprises a delay stage having a delay period of reduced dependence on the level of a voltage supply. One end of a current path of an input transistor is coupled to this voltage supply. The other end of the current path is coupled to a fixed resistor. The resistor couples the input transistor to a signal node. A control electrode of the input transistor is coupled to an input node. An input of an inverter is coupled to the signal node and has an output for transmitting the input signal after a predetermined delay. The fixed resistor provides a reduced variation in the predetermined delay with respect to the variation in the level of the voltage supply. It is preferred that the resistance of the fixed resistor be much larger than the current path resistance of the input transistor, such that the time constant of the voltage curve vs. time at the signal node will be substantially constant.

In another aspect of the invention, the inverter comprises first and second transistors of opposite conductivity types that have current paths coupled in series. The first transistor has the same conductivity type as the input transistor. The trigger point of this transistor pair is preferably chosen to be near the difference between the first voltage supply level and the threshold voltage of the first transistor of the inverter such that when the first voltage supply level changes, the trigger point will be displaced approximately as much as the displacement in the voltage supply level. In yet another aspect of the invention, the signal node is coupled to a capacitor whose capacitance value is selected to be much larger than the parasitic capacitance of the fixed resistor.

In a further aspect of the invention, the trigger point of the inverter transistor pair is fixed by specifying a width of the first transistor to be approximately ten times the width of the second transistor the lengths of both transistors being the same. On the other hand, the width to length ratios of input transistor and a transistor of opposite conductivity coupled in series therewith in the first inverter pair are chosen to be about the same. The channel length of the input transistor is made short to decrease its resistance in relation to the resistance of the fixed resistor.

The principal advantage of the invention is a substantial reduction in the amount of dependence of the delay stage on variations in the voltage supply. The rate of rise or fall at the signal node in response to the application of an input signal stays more constant, and any variation in this rate is offset by a decrease or increase of the trigger point. In some embodiments, the delay time may vary in the opposite direction, that is, the delay may be shorter at the low $V_{dd}$ level than it is at high $V_{dd}$ levels.

BRIEF DESCRIPTION OF THE DRAWINGS

Further aspects of the invention and their advantages will be discerned in the following detailed description taken in conjunction with the drawings, in which:

FIG. 1 is a schematic electric circuit diagram of a delay stage according to the prior art;

FIG. 2a is a timing diagram showing voltage curves at an input node, an intermediate signal node and an output node of the prior art circuit of FIG. 1 with a normal $V_{dd}$ level applied thereto;

FIG. 2b is a timing diagram similar to FIG. 2a showing the effects of dropping the $V_{dd}$ voltage level in the prior art circuit;

FIG. 3 is a schematic electric circuit diagram of a delay stage according to the invention;

FIG. 4 is an electrical circuit diagram of a basic RC circuit used to explain the operation of the invention;

FIG. 5a is a voltage timing diagram showing voltage curves at an input node, an intermediate signal node and an output node of the circuit of FIG. 3 with a normal $V_{dd}$ level applied thereto; and FIG. 5b is a voltage timing diagram similar to FIG. 5a showing the effects of dropping the voltage supply level in the circuit of the invention.

DETAILED DESCRIPTION OF THE INVENTION

FIG. 1 is an electric schematic diagram of a delay stage according to the prior art and indicated generally at 10. An input node 12 is connected to gates 14 and 16 of respective p-channel and n-channel transistors 18 and 20. Transistors 18 and 20 comprise a first inverter 21. The current path of the p-channel transistor 18 is operable to connect the voltage supply $V_{dd}$ to an internal node 22. The current path of the n-channel transistor 20 is operable to connect the internal node 22 to ground or a second voltage supply $V_{ss}$.

A metal/oxide/semiconductor field-effect transistor (MOSFET) capacitor 26 is connected to the internal node 22, as are the gates 28 and 30 of respective p-channel and n-channel transistors 32 and 34. Transistors 32 and 34 together comprise a second inverter stage indicated generally at 36. The current path of the p-channel transistor 32 is operable to connect the voltage supply $V_{dd}$ to an output node 38, while the current path of the n-channel transistor 34 is operable to connect the output node 38 to the second voltage supply.

The operation under normal conditions of this conventional delay stage is explained in conjunction with FIG. 2a. A descending-edge input waveform ($V_{in}$) is indicated by a dashed line. When $V_{in}$ falls to below the threshold voltage $V_{tp}$ (not shown) of transistor 18, the internal node 22 and the MOSFET capacitor 26 coupled thereto begin to be charged as shown by the dotted line $V_{22}$. The slope of the linear voltage rise curve $V_{22}$ is determined by the RC time constant of node 22, in turn predominantly determined by the variable resistance of the current path of the p-channel transistor 18 in combination with the capacitance of the MOSFET capacitor 26. The channel length of the p-channel transistor 18 is made long in order to increase its resistance, thereby increasing the RC time constant of the node 22.

At a time 50 (FIG. 2a), the voltage at node 22 has risen to the trigger point of the second inverter stage 36. The trigger point is determined by the relative geometries of the p-channel transistor 32 and the n-channel 34, and is conventionally somewhere between the n-channel threshold voltage and a voltage level that is one p-channel threshold below $V_{dd}$. Once the trigger point is reached, the p-channel transistor 32 begins to turn off and the n-channel transistor 34 begins to turn on, thereby causing the output voltage waveform $V_{out}$ (indicated by a solid line) to begin to fall.

FIG. 2b is a timing diagram of the corresponding waveforms that result when $V_{dd}$ drops from its usual voltage value (five volts in the illustrated embodiment) to a lesser value such as four volts in the illustrated embodiment. A drop in $V_{dd}$ causes the resistance of the p-channel transistor 18 to increase, thereby reducing the slope of the waveform $V_{22}$. The trigger point will also drop, but not as much as the drop in $V_{dd}$. The combination of these two effects results in a much longer delay, as the output waveform begins to fall only after a time 52. This variation is usually on the order of sixty percent.

FIG. 3 is a schematic electric diagram of a delay stage according to the invention, which is indicated generally at 60. An input signal node 62 is connected to the gates 64 and 66 of respective p-channel and n-channel field effect transistors 68 and 70. The current path of the p-channel transistor 68 is operable to connect the voltage supply $V_{dd}$ to the first end of a fixed resistor 72, here shown together with its parasitic capacitance 74. A second end of the fixed resistor is connected to an internal signal node 76, which in turn is operable to be connected to a second voltage supply $V_{ss}$ by the current path of the n-channel transistor 70. Transistor 68, resistor 72 and transistor 70 together comprise a first inverter indicated generally at 78.

A MOSFET capacitor 80 is connected to the internal node 76, which further is connected to gates 82 and 84 of respective p-channel and n-channel transistors 86 and 88. Transistors 86 and 88 together comprise a second inverter stage indicated generally at 90. The current path of the p-channel transistor 86 is operable to couple the voltage supply $V_{dd}$ to an output node 92, while the current path of the n-channel transistor 88 is operable to couple the output node 92 to the second voltage supply $V_{ss}$.

In place of a relatively long-channel p-channel transistor 18 (FIG. 1), the p-channel transistor 68 has a channel region with a relatively large width to length ratio to decrease its resistance. The former long-channel resistance is replaced in large part by a fixed resistor 72. The value of the fixed resistor 72 does not change with the value of the voltage supply $V_{dd}$. Therefore, the time constant of the voltage rise at the signal node 76 can be expected to vary much less. It is also preferable to choose the capacitance value of MOSFET capacitor 80 to be relatively large in comparison to the parasitic capacitance 74 of the resistor 72, because a relatively small parasitic capacitance of the resistor will cause a rapid rise in the voltage at the internal node 76 until the $V_t$ of the MOSFET capacitor 80 is reached. These effects will be more particularly described in conjunction with FIGS. 5a and 5b.

The structural characteristics of second inverter transistors 86 and 88 are also preferably changed from their conventional counterparts, transistors 32 and 34 (FIG. 1). The trigger point of the second inverter 90 is selected to be very close to the difference $V_{dd}-V_{tp}$, where $V_{tp}$ is the threshold voltage of the p-channel transistor 86. In this way, when $V_{dd}$ drops, the trigger point will make a corresponding and almost equally as large a drop. To obtain this high trigger point, the width of the p-channel transistor 86 is chosen to be much larger than usual. In the more conventional case, the width of the p-channel transistor 32 (FIG. 1) is selected to be approximately three times the width of the n-channel transistor 34. This is changed in the circuit of the invention, such that the width of the p-channel transistor 86 (FIG. 3) is preferably about ten times that of the n-channel transistor 88. It is further preferred that the lengths of the channels of transistors 86 and 88 be extended with respect to the lengths of transistors 68 and 70 to avoid channel hot electron degradation.

To obtain a better understanding of the operation of the invention, a mathematical analysis is set out below. In the basic RC circuit shown at FIG. 4, if $V_{out}$ is zero at a time equal zero, then:

$$V_{out}(t) = V_{in}(1 - e^{-t/RC}) \tag{1}$$

We can express $V_{out}$ as a fraction of $k(t)$ of $V_{in}$;

$$V_{out}(t) = k(t)V_{in} = V_{in}(1 - e^{-t/RC}), 0 < k(t) < 1 \tag{2}$$

therefore, $$k(t) = 1 - e^{-t/RC} \tag{3}$$

Rearranging to find the time t required for k to reach a given value:

$$t = (RC)\ln\frac{1}{1-k}, \, 0 < k < 1 \tag{4}$$

Note that t increases as k increases, as is expected. More importantly, t, or the time required for $V_{out}$ to reach some fraction of $V_{in}$ does not depend on $V_{in}$. Therefore, if $V_{in}$ is six volts, it takes just as long for $V_{out}$ to rise to three volts as it takes $V_{out}$ to rise to two volts when $V_{in}$ is four volts, as k equals one half in either case.

For our purposes, we define the "trigger point" of an inverter as the input level that corresponds to the point on an inverter's input-output transfer curve where the output is at $V_{dd}/2$. If we assume that the trigger point of a CMOS inverter is a constant fraction of $V_{dd}$, a $V_{dd}$ independent delay stage can be constructed by connecting $V_{in}$ to $V_{dd}$ and driving the input of a CMOS inverter with $V_{out}$. If the inverter trigger point is $cV_{dd}$, then substituting c for k in equation (4) gives the time required for $V_{out}$ to reach the trigger point of the inverter. Assuming the inverter takes a negligible amount of time to switch, the delay of the circuit is $(RC)\ln(1/(1-c))$, a quantity that is independent of $V_{dd}$.

In the actual circuit, we use a MOSFET capacitor instead of the ideal capacitor modeled in equation (4). A MOSFET capacitor has very little capacitance when its $V_{gs}$ is less than the equivalent n-channel threshold voltage $V_{tn}$. $V_{out}$ rises quickly to $V_{tn}$ and rises slowly after that.

This quick rise can be approximated as instantaneous. We can then find an expression for $V_{out}$ by modeling the MOSFET capacitor as an ideal capacitor by letting $V_{out}$ equal $V_{tn}$ at a time t equal to zero:

$$V_{out}(t) = V_{tn} + (V_{in} - V_{tn})(1 - e^{-t/RC}) \quad (5)$$

As before, $V_{out}$ can be expressed as a fraction of $V_{in}$ and $$t = RC\left[\ln\left(\frac{1}{1-k}\right) - \ln\left(\frac{V_{in}}{V_{in}-V_{tn}}\right)\right], \quad (6)$$

$$0 < k < 1, kV_{in} > V_{tn}$$

This is the same as equation (4) with the additional term $-\ln(V_{in}/(V_{in}-V_{tn}))$. $V_{in}/(V_{in}-V_{tn})$ is greater than one for $V_{in}$ greater than $V_t$, and it decreases as $V_{in}$ increases, approaching one for large $V_{in}$. The quantity $\ln(V_{in}/(V_{in}-V_t))$ is therefore positive for $V_{in}$ greater than $V_t$, and it decreases as $V_{in}$ increases, approaching zero for large $V_{in}$. If we drive a CMOS inverter with $V_{out}$ as before, the delay of the circuit increases as $V_{dd}$ increases, the opposite of the normal $V_{dd}$ variation experienced in a conventional CMOS delay stage.

The above analysis assumes that the trigger point of a CMOS inverter is a constant fraction of a $V_{dd}(cV_{dd})$. In actuality, if the trigger points of various inverters are plotted versus $V_{dd}$, they are extrapolated to pass through a trigger point of zero at $V_{dd}$ near one volt. The trigger point of a high trigger point inverter approximates $V_{dd}-V_{tp}$. Taking the trigger point of the second inverter stage into account, the delay given by equation (4) can be found by expressing the inverter trigger point as $cV_{dd}$ where $c=(V_{dd}-V_{tp})/V_{dd}$. This gives:

$$t = RC\ln\left(\frac{1}{1-\left(\frac{V_{dd}-V_{tp}}{V_{dd}}\right)}\right) = RC\ln\left(\frac{V_{dd}}{V_{tp}}\right) \quad (7)$$

Clearly, this time increases as $V_{dd}$ increases. The effects of the high trigger point inverter and the MOSFET capacitor modeled in equation (6) can be combined by substituting $k = c = (V_{dd}-V_{tp}/V_{dd})$ in equation (6):

$$t = RC\ln\left(\frac{V_{dd}-V_{tn}}{V_{tp}}\right), \quad V_{dd}-V_{tp} > V_{tn} \quad (8)$$

This expression increases with $V_{dd}$ even more rapidly than equation (7).

The above mathematical analysis treats the elements of the circuit as ideal. In particular, we have assumed that the resistance of the fixed resistor 72 (FIG. 3) does not change and that it does not have any parasitic capacitance, but since there is a p-channel transistor 68 in series with the resistor in the actual stage 60, it will exhibit significant changes in conductivity with $V_{dd}$. To minimize the effects of this, the channel width of transistor 68 should be made wide enough such that its resistance is small with respect to the resistance of the fixed resistor 72.

Also, there is considerable parasitic capacitance 74 on the resistor 72, and this capacitance degrades the validity of our assumption of an instantaneous rise to $V_{tn}$ on node 76. To limit this effect, capacitor 80 should be large compared to the parasitic capacitor 74. To avoid excessive sensitivity to process variations, the resistor geometry should be made to be substantially wider than the minimum design rule.

As discussed above, the width to length ratio of the p-channel transistor 86 should be much larger than the width to length ratio of the n-channel transistor 88. The gate of the n-channel transistor 88 gives a larger effective MOS capacitance. The transistor 86 has a gate that is biased the wrong way to give the same effect, so its gate capacitance is parasitic.

Because of these parasitic effects combined with normal variations of the inverter, the input logic, and the output buffering stages of a circuit using circuit 60 as a delay stage, such a circuit's actual delay may still show some decrease at a high $V_{dd}$, but this variation is only about twenty percent of the total low $V_{dd}$ delay.

The reduction of voltage supply variation dependence can be shown in conjunction with FIGS. 5a and 5b. In FIG. 5a, a descending-edge input waveform $V_{in}$ is again represented by a dashed line. When the input waveform $V_{in}$ declines to below the threshold voltage $V_{tp}$ of the transistor 68, the signal node 76 will begin to be charged up at a high rate as shown by curve segment 100. The RC time constant responsible for the slope of this curve owes its capacitance to the parasitic capacitance 74 of the fixed resistor 72. When the signal node 76 goes above below the n-channel threshold voltage of the capacitor 80, the total equivalent capacitance becomes larger and therefore, the time constant of a second curve segment 102 becomes longer. As previously discussed, it is desirable to make the capacitance of MOSFET capacitor 80 much larger than that of parasitic capacitor 74 to preserve the "kink" between segments 100 and 102.

At a time 104, the voltage at node 76 (shown as a dotted line in FIG. 5a) reaches the inverter trigger point, which is about the same as the difference between the supply voltage level $V_{dd}$ and the p-channel threshold voltage $V_{tp}$ of the transistor 86 (FIG. 3). At this point, the output voltage seen at output node 92 begins to decline, and a delayed output curve is generated.

FIG. 5b illustrates the effects of lowering the supply voltage level $V_{dd}$ from five volts to four volts. As explained above, the time constant of the voltage waveform seen at node 76 does not increase as greatly as it did between FIG. 2a and 2b, as most of the resistance is unaffected by the drop of the voltage $V_{dd}$. The trigger point, however, drops faster, generally by the same amount that $V_{dd}$ drops. Therefore, the $V_{76}$ meets the trigger point at a time 106 that is at least as early as, and may be earlier than, the time 104, which is the end of the delay period.

While the present invention has been described for the example of a delay stage 60 designed to produce a delayed falling waveform, it has equal application to a delay stage designed to delay a rising waveform. In this last instance (not illustrated), the fixed resistor 72 (FIG. 3) would be placed between the current path of the n-channel transistor 70 and the node 76. The trigger point of the second stage 90 will be placed to be very close to $V_{tn}+V_{ss}$. This trigger point would in turn be obtained by selecting a width of the n-channel transistor 88 to be larger than the channel width of the p-channel transistor 86, rather than only a third as much for the more conventional case.

While the present invention and its advantages has been described in conjunction with a preferred embodiment in the above detailed description, the invention is not limited thereto, but only by the scope and spirit of the appended claims.

What is claimed is:

1. A delay stage circuit comprising:
   a p-channel input transistor having a first electrode for receiving an input signal, said transistor providing a current path between a voltage supply and an internal node;
   an inverter having an input node for receiving a signal from the current path and an output node for providing an output signal a predetermined time after the input signal is received at the first electrode, said inverter including a first p-channel transistor having a current path connected in series with a current path of a second transistor, said first transistor having a conductivity different from said second transistor, control electrodes of said first and second transistors coupled in common, forming said input node, and coupled to said internal node, and said output node coupled between current paths of said first and second transistors, the channels of said first and second transistors having predetermined width to length ratios, the width to length ratio of said first transistor being about ten times the width to length ratio of said second transistor;
   a fixed resistor coupled in series in the current path between the input transistor and the internal node, said resistor providing greater resistance along the current path than said input transistor;
   a capacitor having a first terminal connected to the internal node and a second terminal connected to a reference potential; and
   a trigger point for inverting a rising voltage at said internal node is approximately equal to the difference between the level of the voltage supply and the threshold voltage of said first transistor.

2. A delay stage circuit comprising:
   an input transistor having a first electrode for receiving an input signal, said transistor providing a current path between a voltage supply and an internal node;
   an inverter having an input node for receiving a signal from the current path and an output node for providing an output signal a predetermined time after the input signal is received at the first electrode, said inverter including a first transistor having a current path connected in series with a current path of a second transistor, said first transistor having a conductivity type the same as said input transistor and different from said second transistor, control electrodes of said first and second transistors coupled in common, forming said input node, and coupled to said internal node, and said output node coupled between the current paths of said first and second transistors;
   a fixed resistor coupled in series in the current path between the input transistor and the internal node, said resistor providing greater resistance along the current path than said input transistor;
   a capacitor having a first terminal connected to the internal node and a second terminal connected to a reference potential; and
   wherein said first and second transistors of said inverter have channel regions that are substantially longer than a channel region of said input transistor.

3. A method for fabricating a delay stage having reduced variation in the delay period with respect to a level of a voltage supply, comprising the steps of:
   forming a CMOS inverter with a pair of first inverter transistors having opposite conductivity types;
   forming a fixed resistor to connect one end of a current path of one of the first inverter transistors to a signal node;
   connecting a capacitor between the signal node and a reference potential;
   connecting a second end of the current path of the one of the first inverter transistors to the voltage supply;
   connecting a second inverter, with a pair of second inverter transistors, between the signal node and an output of the delay stage; and
   forming the channel lengths of the transistors of the second inverter to be longer than the channel lengths of the transistors of the first inverter in order to avoid channel hot-electron degradation.

4. A method for fabricating a delay stage having reduced variation in the delay period with respect to a level of a voltage supply, comprising the steps of:
   forming a CMOS inverter with a pair of first inverter transistors having opposite conductivity types;
   forming a fixed resistor to connect one end of a current path of one of the first inverter transistors to a signal node;
   connecting a capacitor between the signal node and a reference potential;
   connecting a second end of the current path of the one of the first inverter transistors to the voltage supply;
   connecting a second inverter, having first and second transistor, between the signal node and an output of the delay stage; and
   the step of fabricating the channel regions of the first and second transistors of the second inverter such that the width to length ratio of one of the second inverter transistors having the same conductivity type as one transistors of the first inverter is about ten times that of the width to length ratio of an channel region of the other transistor of the second inverter.

5. A delay stage circuit comprising:
   an input p-conductivity type field effect transistor having a first electrode for receiving an input signal, said transistor providing a current path between a voltage supply and an internal node;
   an inverter having an input node, coupled to said internal node, for receiving a signal from the current path and an output electrode for providing an output signal a predetermined time after the input signal is received at the first electrode;

a fixed resistor arranged in series in the current path between the input transistor and the internal node, said resistor providing greater resistance along the current path than said input transistor;

an n-channel input transistor having a current path coupled between said internal node and the reference potential, wherein a gate of the n-channel transistor is coupled to said first electrode of said p-channel transistor and the ratio of width to length of said input transistor channel regions is one; and a capacitor having a first terminal connected to the internal node and a second terminal connected to a reference potential.

6. A delay stage circuit comprising:

an input transistor having an electrode for receiving an input signal, said transistor providing a current path between a voltage supply and an internal node;

an inverter having an input node, coupled to said internal node, for receiving a signal from the internal node and an output node for providing an output signal a predetermined time after the input signal is received at the input transistor, said inverter having a trigger point for inverting a rising voltage on said internal node when the voltage on the internal node is approximately equal to the difference between the level of the voltage supply and a fixed value;

said inverter includes a first transistor having a current path connected in series with a current path of a second transistor of opposite conductivity type, control electrodes of said first and second transistors coupled in common forming said input node and coupled to said internal node, said output node coupled between the current paths of said first and second transistors, said first and second transistors have channel lengths that are extended with respect to the channel length of said input transistor to avoid channel hot electron degradation;

a fixed resistor coupled in series in the current path, said resistor providing greater resistance along the current path than said input transistor; and a capacitor having a first terminal connected to the internal node and a second terminal connected to a reference potential.

7. A delay stage circuit comprising:

an input transistor having an electrode for receiving an input signal, said transistor providing a current path between a voltage supply and an internal node;

an inverter having an input node, coupled to said internal node, for receiving a signal from the internal node and an output node for providing an output signal a predetermined time after the input signal is received at the input transistor, said inverter having a trigger point for inverting a rising voltage on said internal node when the voltage on the internal node is approximately equal to the difference between the level of the voltage supply and a fixed value;

said inverter includes a first p-channel transistor having a current path connected in series with a current path of a second transistor of opposite conductivity type, control electrodes of said first and second transistors coupled in common forming said input node and coupled to said internal node, said output node coupled between the current paths of said first and second transistors, the channels of said first and second transistors having predetermined width to length ratios, the width to length ratio of said first transistor being about ten times the width to length ratio of said second transistor;

a fixed resistor coupled in series in the current path, said resistor providing greater resistance along the current path than said input transistor; and a capacitor having a first terminal connected to the internal node and a second terminal connected to a reference potential.

8. A delay stage circuit comprising:

an input transistor having an electrode for receiving an input signal, said transistor providing a current path between a voltage supply and an internal node;

an inverter having an input node, coupled to said internal node, for receiving a signal from the internal node and an output node for providing an output signal a predetermined time after the input signal is received at the input transistor, said inverter having a trigger point for inverting a falling voltage on said internal node when the voltage on the internal node is about a fixed value;

said inverter includes a first transistor having a current path connected in series with a current path of a second transistor of opposite conductivity type, control electrodes of said first and second transistors coupled in common forming said input node and coupled to said internal node, said output node coupled between the current paths of said first and second transistors, said first and second transistors have channel lengths that are extended with respect to the channel length of said input transistor to avoid channel hot electron degradation, a fixed resistor coupled in series in the current path, said resistor providing greater resistance along the current path than said input transistor; and a capacitor having a first terminal connected to the internal node and a second terminal connected to a reference potential.

9. A delay stage circuit comprising:

an input transistor having an electrode for receiving an input signal, said transistor providing a current path between a voltage supply and an internal node;

an inverter having an input node, coupled to said internal node, for receiving a signal from the internal node and an output node for providing an output signal a predetermined time after the input signal is received at the input transistor, said inverter having a trigger point for inverting a falling voltage on said internal node when the voltage on the internal node is about a fixed value;

said inverter includes a first n-channel transistor having a current path connected in series with a current path of a second transistor of opposite conductivity type, control electrodes of said first and second transistors coupled in common forming said input node and coupled to said internal node, said output node coupled between the current paths of said first and second transistors, the channels of said first and second transistors having predetermined width to length rations, the width to length ratio of said first transistor being greater than the width to length ratio of said second transistor;

a fixed resistor coupled in series in the current path, said resistor providing greater resistance along the current path than said input transistor; and a capacitor having a first terminal connected to the internal node and a second terminal connected to a reference potential.

10. A method for fabricating a delay stage having reduced variation in the delay period with respect to a level of a voltage supply, comprising the steps of:

forming an input transistor;

forming a fixed resistor to connect one end of a current path of the input transistor to a signal node;

connecting a capacitor between the signal node and a reference potential;

connecting a second end of the current path of the input transistor to the voltage supply;

connecting an inverter, with a pair of inverting transistors, between the signal node and an output of the delay stage; and forming the channel lengths of the transistors of the inverter to be extended with respect to the channel length of said input transistor to avoid channel hot-electron degradation.

11. A method for fabricating a delay stage having reduced variation in the delay period with respect to a level of a voltage supply, comprising the steps of:

forming an input transistor;

forming a fixed resistor connected in series with a current path of the input transistor to form a controlled current path;

connecting one end of the controlled current path to the voltage supply and the other end to a signal node;

connecting a capacitor between the signal node and a reference potential;

connecting an inverter between the signal node and an output of the delay stage, said inverter including a first and a second transistor of opposite conductivity types, with the control electrode of each transistor coupled to the signal node, one end of the current path of each transistor coupled to the output, the other end of the current path of the first transistor coupled to the voltage supply, and the other end of the current path of the second transistor coupled to the reference potential; and fabricating the channel regions of the first and second transistors of the inverter such that the width to length ratio of the first transistor is about ten times the width to length ratio of the second transistor.

* * * * *